United States Patent
Waller et al.

[11] Patent Number: 6,134,160
[45] Date of Patent: Oct. 17, 2000

[54] MEMORY DEVICE ARCHITECTURE HAVING GLOBAL MEMORY ARRAY REPAIR CAPABILITIES

[75] Inventors: William K. Waller, Rockwall, Tex.; Kuo-Yuan Hsu, San Jose, Calif.

[73] Assignee: Texas Instruments Incorporated, Dallas, Tex.

[21] Appl. No.: 09/406,385

[22] Filed: Sep. 27, 1999

(Under 37 CFR 1.47)

[51] Int. Cl.$^7$ ...................................................... G11C 7/10
[52] U.S. Cl. ............... 365/200; 365/230.04; 365/230.03; 365/189.02; 365/230.06; 365/185.09; 365/185.13; 365/185.11
[58] Field of Search ............................... 365/200, 189.02, 365/225.7, 230.03, 230.04, 230.06, 185.09, 185.11, 185.12, 185.13, 185.23

[56] References Cited

U.S. PATENT DOCUMENTS

| | | | |
|---|---|---|---|
| 4,253,059 | 2/1981 | Bell et al. ................................ | 714/721 |
| 4,393,475 | 7/1983 | Kitagawa et al. ....................... | 365/201 |
| 4,733,394 | 3/1988 | Giebel ..................................... | 714/711 |

*Primary Examiner*—Andrew Q. Tran
*Attorney, Agent, or Firm*—Robby T. Holland; Carlton H. Hoel; Frederick J. Telecky, Jr.

[57] ABSTRACT

An architecture for a high-capacity high-speed semiconductor memory device is disclosed. The semiconductor memory device includes memory cell arrays (406) having local word lines and bit lines. The memory cell arrays (406) are further arranged into array groups (402a–402d and 404a–404d). The local word lines (410a–410d) of the memory cell arrays of the same group are commonly connected to global word lines (408). The array groups (402a–402d and 404a–404d) provide data access paths to their respective memory cells by sets of input/output (I/O) lines (416a–416d and 420a–420d). The I/O line sets (416a–416d and 420a–420d) are coupled to data amplifiers by interarray multiplexers (MUXs) (422a–422d). The interarray MUXs (422a–422d) enable defective global word lines of one array group to be replaced by redundant global word lines of an adjacent array group.

20 Claims, 11 Drawing Sheets

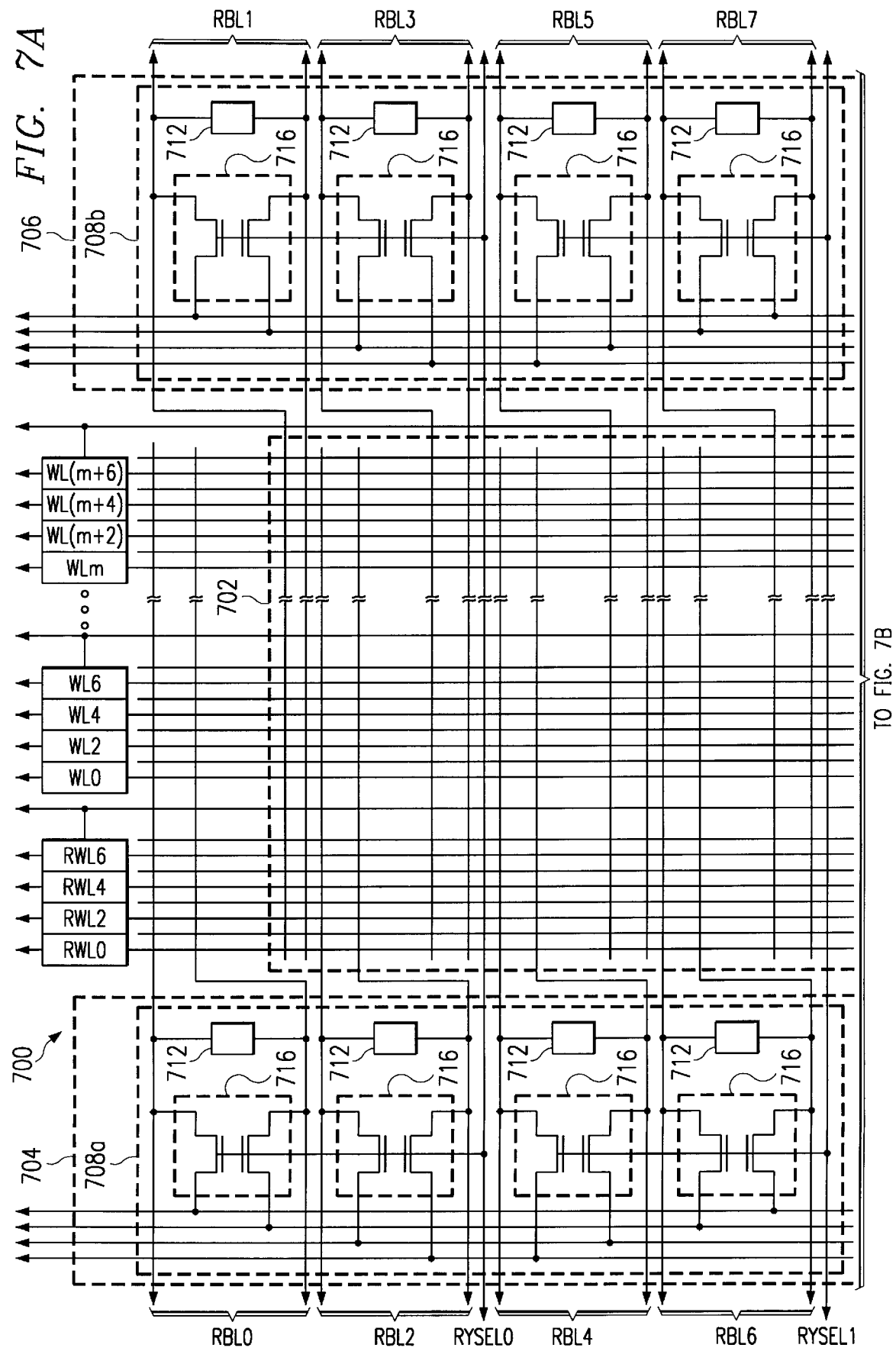

MEMORY DEVICE ARCHITECTURE HAVING GLOBAL MEMORY ARRAY REPAIR CAPABILITIES

TECHNICAL FIELD

The present invention relates generally to semiconductor memory devices, and more particularly to repair circuits for high capacity semiconductor memory devices.

BACKGROUND OF THE INVENTION

The typical semiconductor memory device usually includes a large number of memory cells arranged into columns and rows to form one or more memory cell arrays. The memory cells of the same row are commonly coupled to a word line, while the memory cells of the same column are commonly coupled to a bit line (or pair of bit lines). For smaller capacity memory devices such conventional row and column arrangements allow adequate speed in accessing the data within the memory cells.

The increasing computing power and complexity of electronic systems has given rise to a demand for higher density and higher speed semiconductor memory devices. Conventional approaches that utilize one or more memory cell arrays, each having one set of word lines and bit lines, do not provide the compact size and rapid speed necessary to address the needs of more compact and powerful systems. One approach to improve a semiconductor memory device is to utilize "global" word lines. Semiconductor memory devices with global word lines will typically include a number of memory cell arrays, each with its own set of "local" word lines. Global word lines extend over groups of memory cell arrays, and are coupled to the local word lines of the arrays. Such arrangements allow for a row decoder circuit that is shared among multiple arrays, and thus provides for a more compact arrangement. Furthermore, the global word lines can be fabricated from a lower resistance material, improving the overall speed of the semiconductor memory device.

The memory cells within a high-density array are accessed according to various memory device operations. Such operations include read operations (common to nearly all memory devices), write operations (common to volatile memory devices), and program and erase operations (common to many nonvolatile memory devices). To access memory cells, an external memory address is applied which activates a word line within a predetermined group of arrays. When activated, the word line couples a row of memory cells to the bit lines of the array. A data input/output (I/O) path is then enabled between the bit lines of the array and a data amplifier circuit.

An example of a data access operation is set forth in FIG. 1A. FIG. 1A is a block schematic diagram that illustrates a portion of a semiconductor memory device. The portion is designated by the general reference character 100 and is shown to include four memory cell arrays (102a–102d). Each memory cell array includes a number of local word lines (not shown) that are coupled to global word lines common to all of the memory cell arrays (102a–102d). A group of local word lines may be coupled to each global word line by a local row driver circuit. Thus, when a global word line is activated, according to local decoding signals, one of the local word lines associated with the activated global word line will be selected.

Within FIG. 1A, a global word line is shown at item 104, and represents a global word line that has been activated by a row decoder circuit 106 in response to an applied address.

Each memory cell array (102a–102d) further includes an associated set of even bit lines (108a–108d) and odd bit lines (110a–110d). Each set of even bit lines (108a–108d) is coupled to an associated even sense amplifier bank (112a–112d). In a similar fashion, each set of odd bit lines (110a–110d) is coupled to an associated odd sense amplifier bank (114a–114d). Each even and odd sense amplifier bank (112a–112d and 114a–114d) includes sense amplifiers and select gates (not shown). According to other address information, the select gates couple selected bit lines to even I/O lines 116 and to odd I/O lines 118. The even I/O lines 116 are coupled to a first data amplifier 120, and the odd I/O lines 118 are coupled to a second data amplifier 122.

In the particular prior art example of FIG. 1A, a data access to the memory cell 102b is illustrated. The resulting data path from memory cell array 102b to the data amplifiers (120 and 122) is illustrated by a dashed line. Thus, in the case of a read operation, the activated global word line 104 results in the activation of a local word line within memory cell array 102b. Data signals are placed on even bit line set 108b and odd bit line set 110b. Even and odd sense amplifier banks 112b and 114b are activated, placing amplified data signals on the even and odd I/O lines (116 and 118). The data signals on the I/O lines (116 and 118) are further amplified by the first and second data amplifiers (120 and 122).

Despite continuing advances in semiconductor integrated circuit manufacturing technology, in the course of fabricating a semiconductor memory device, manufacturing defects can give rise to nonfunctional memory cells within an array. In order to preserve the functionality of memory devices having such defects, redundant memory cells are often employed. Redundant memory cells are extra memory cells that are used to replace defective memory cells. A typical redundancy scheme includes row-wise redundancy, in which one or more extra rows of memory cells are created within a memory cell array, and column-wise redundancy, in which one or more extra columns of memory cells are created within the memory cell array.

In architectures utilizing global word lines, redundant global word lines can also be used. FIG. 1B sets forth an example of the architecture set forth in FIG. 1A in which a redundant global word line is used to replace a defective global word line 104'. In FIG. 1B, it is assumed that global word line 104' is defective (by a short, or the like). To avoid losing the functionality of all four memory cell arrays (102a–102d), a redundant global word line 124 is provided. It is understood that the redundant global word line 124 is coupled to a group of redundant local word lines within each memory cell array (102a–102d). In operation, the addresses corresponding to the defective global word line 104' are identified, and redundancy circuits enabled, so that the redundant global word line 124 will be activated in lieu of the defective global word line 104'. In this manner, the redundant global word line 124 is activated, and according to local address signals, a redundant local word line within memory cell array 102b is selected, coupling a row of redundant memory cells to the odd bit line set 108b and even bit line set 110b. The sense amplifier banks (112b and 114b), I/O lines (116 and 118), and data amplifiers (120 and 122) operate as previously described in conjunction with FIG. 1A.

A drawback to the redundancy arrangement of FIG. 1B can arise in the event the redundant global word line 124 is also defective. In such a case, all four memory cell arrays (102a–102d) can be rendered non-operational. While more redundant global word lines could be added, such an approach would require the addition of one more group of redundant local word lines to each of the memory cell arrays (102a–102d), undesirably adding to the overall size of the semiconductor memory device.

It would be desirable to arrive at a semiconductor memory device architecture that employs global word lines, but that does not suffer from the limited redundancy capabilities of the prior art. At the same time, such a memory device should remain compact and provide high-speed performance.

SUMMARY OF THE INVENTION

According to the preferred embodiment, an architecture for a high capacity, high-speed semiconductor memory device includes a number of memory cell arrays logically arranged into array groups. Each memory cell array within an array group includes local word lines and bit lines coupled to its respective memory cells. In addition, the local word lines of the memory cell arrays of the same array group are commonly connected to global word lines. The data input/output (I/O) paths from the array groups are connected by interarray multiplexers to data amplifiers. The use of multiplexers allows the redundant global word lines of one array group to be substituted for defective global word lines of an adjacent array group.

According to one aspect of the preferred embodiment, the array groups are further logically arranged into array blocks, which each couple memory cells to a predetermined number of data I/Os. Interblock multiplexers allow the redundant global word lines of one array block to be substituted for defective global word lines of an adjacent array block.

BRIEF DESCRIPTION OF THE DRAWINGS

FIGS. 7A and 7B are block schematic diagrams illustrating a memory cell array of the preferred embodiment.

DETAILED DESCRIPTION OF THE EMBODIMENTS

The preferred embodiment is an architecture for a high-capacity, rapid access semiconductor memory device that employs global word lines and global word line redundancy. The preferred embodiment provides greater flexibility in the implementation of global word line redundancy by allowing for the substitution of global word lines between adjacent sets of memory cell arrays. The preferred embodiment achieves advantages over other redundancy approaches by utilizing multiplexer circuits that enable input/output (I/O) lines to be coupled to either a first data amplifier, or a second, alternate data amplifier. In this manner, in the event all the redundant global word lines of one set of memory cell arrays are defective, the global word lines of an adjacent set of memory cell arrays can be substituted by way of the multiplexer circuits.

Figure 1A:
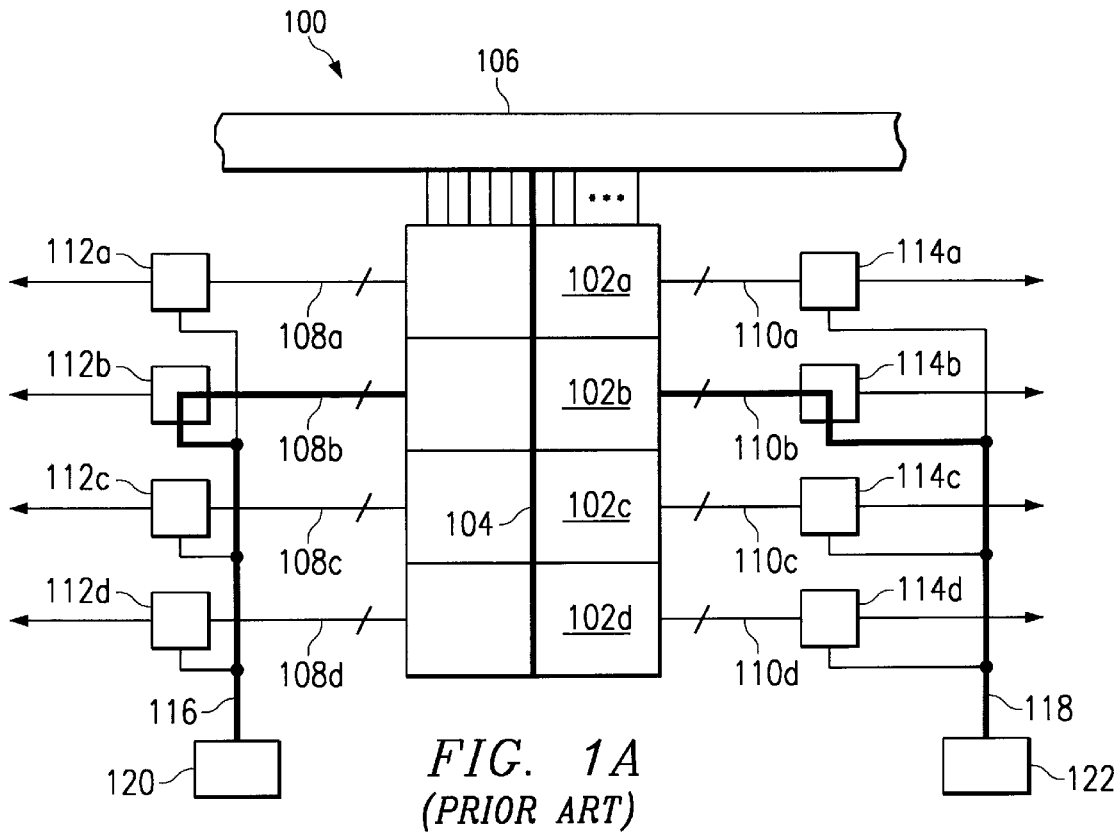
FIG. 1A is a block schematic diagram of a prior art semiconductor memory device architecture that utilizes global word lines.
Figure 1B:
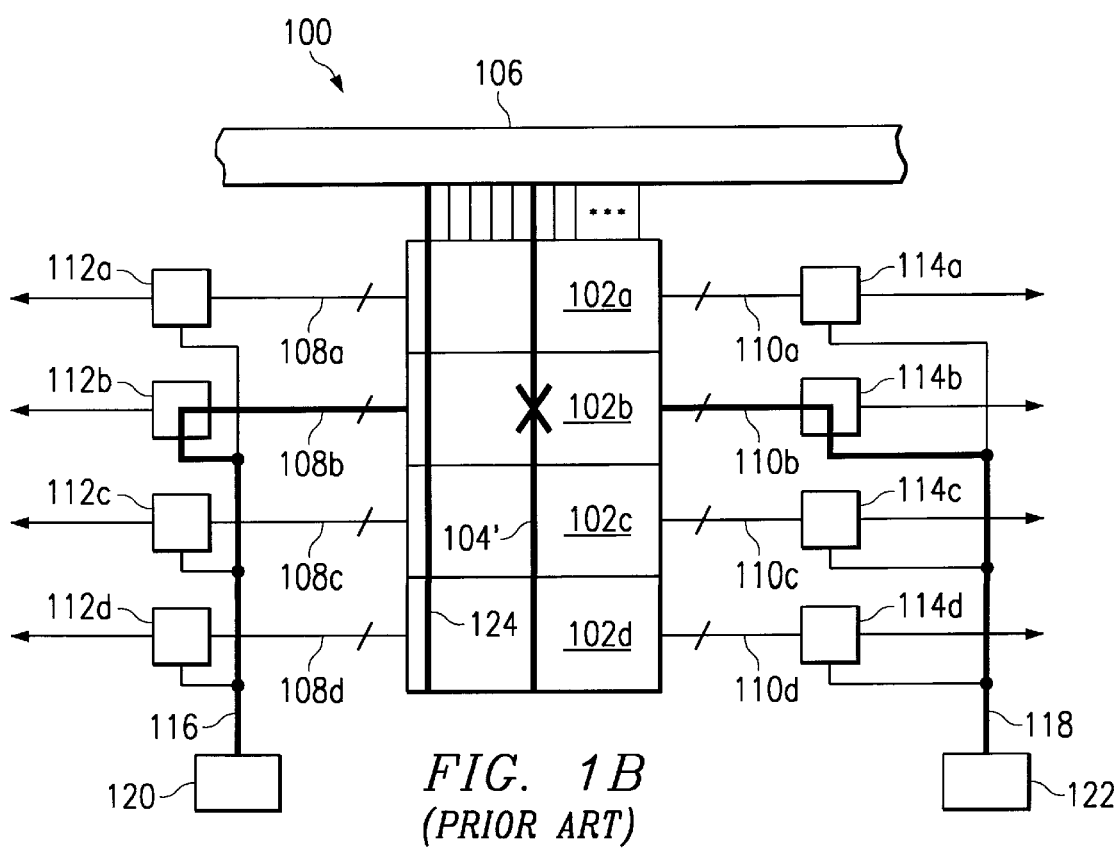
FIG. 1B is a block schematic diagram of the prior art semiconductor memory device architecture of FIG. 1A utilizing conventional global word line redundancy.
Figure 2:
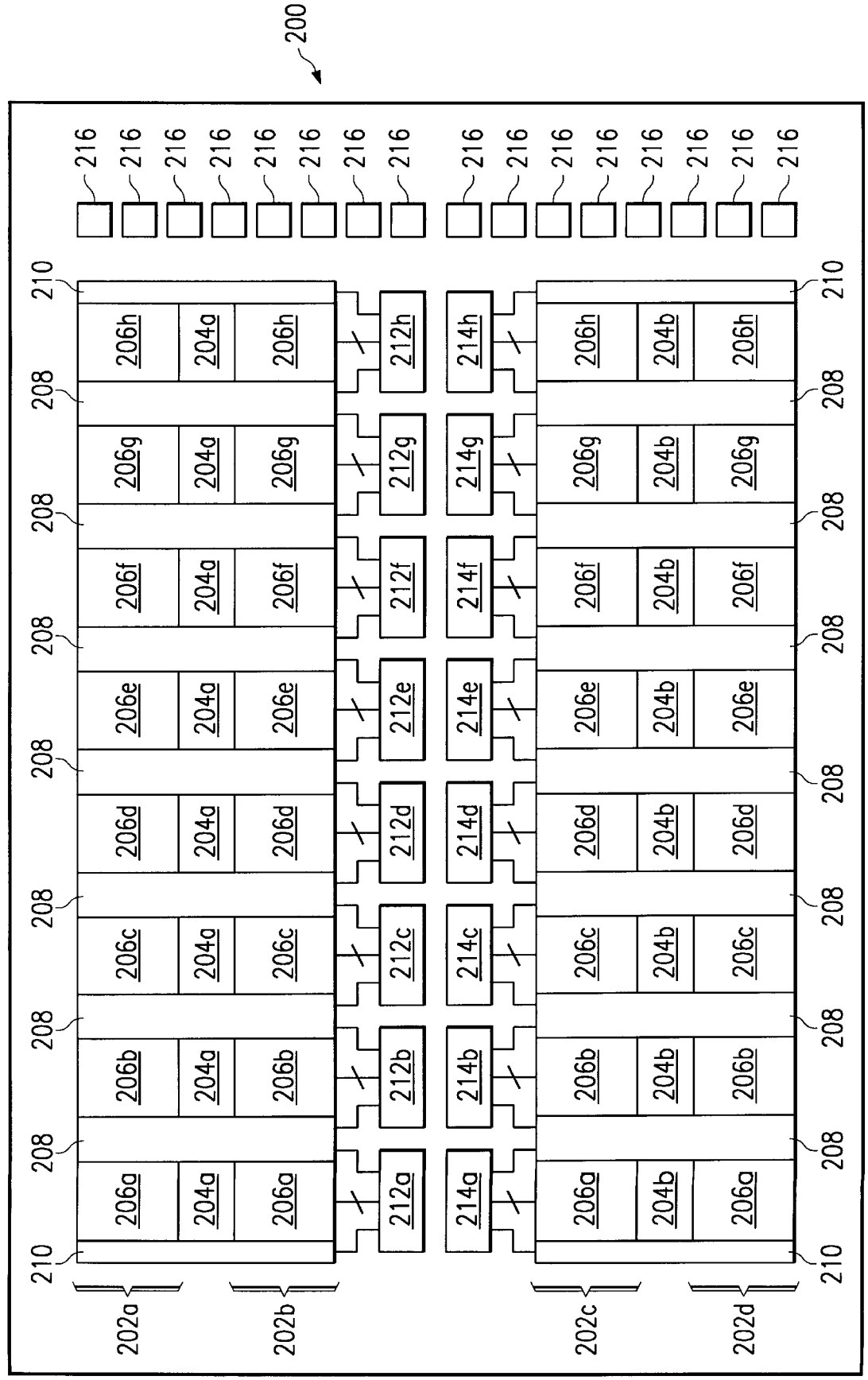
FIG. 2 is a block diagram of the preferred embodiment.

The preferred embodiment is a large capacity semiconductor memory device that includes a large number of memory cell arrays that are subdivided into a number of blocks. A high-level block diagram view of the preferred embodiment is set forth in FIG. 2. The preferred embodiment is designated by the general reference character 200, and is shown to include four array banks, shown as items 202a–202d. Array banks 202a and 202b share a common first row decoder circuit 204a. In a similar fashion, array banks 202c and 202d share a common second row decoder circuit 204b.

Each array bank (202a–202d) is shown to include a number of array blocks (206a–206h). The array blocks (206a–206h) represent a further subdivision of the memory cell arrays, with each array block (206a–206h) including a like number of memory cell arrays. The array blocks (206a–206h) are shown to be each separated from one another by interblock multiplexer (MUX) circuits 208. In addition, those array blocks (206a and 206h) situated at the ends of the semiconductor memory device 200 are coupled to edge MUX circuits 210.

The array blocks (206a–206h) of the first and second array banks (206a–206h) are coupled to first data amplifier banks (212a–212h). In the particular arrangement of FIG. 2, the array blocks 206a to 206h are coupled to the data amplifier banks 212a to 212h, respectively. Thus, the array blocks identified as 206a within array banks 202a and 202b, provide output data signals to, and receive input data signals from, the first data amplifier bank 212a. The array blocks (206a–206h) of array banks 202c and 202d are coupled to second data amplifier banks (214a–214h) in a mirror image fashion to the arrangement between array banks 202a and 202b and the first data amplifier banks 212a–212h.

In addition to being coupled to two of the array blocks (206a–206h), each data amplifier bank (212a–212h and 214a–214h) is further coupled to either two interblock MUX circuits 208, or, in the case of the those array blocks (206a and 206h) situated at the end of the semiconductor memory device 200, an interblock MUX circuit 208 and an edge MUX circuit 210. With this arrangement, data can alternately be provided by an adjacent array block. For example, while array blocks 206b (of array banks 202a and 202b) both provide data signals to data bank 212b, additional data signal can be provided to the data bank 212b by the interblock MUX circuits 208 situated on either side of the array blocks 206b. The interblock MUX circuits 208 are capable of providing data signals from either of the two adjacent array blocks. Thus, the interblock MUX circuit 208 situated between array blocks 206a and 206b can provide data signals to either first data amplifier bank 212a or first data amplifier bank 212b.

The use of interblock MUX circuits 208 adds to the redundancy capabilities of the preferred embodiment 200. In the event an array bank (206a–206h) has redundant global word lines that are defective, thus preventing the array bank from providing data signals to its associated data amplifier bank, the interblock MUX circuits 208 can be used to couple data from redundant memory cells of an adjacent array bank. For example, if redundant global word lines within array block 206c are all defective, preventing array block 206c from providing data to first data amplifier block 212c, the interblock MUX circuit 208 between array blocks 206b and 206c can be used to couple data from a global redundant word line within array bank 206b to the first data amplifier bank 212c. Alternatively, the interblock MUX circuit 208 between array blocks 206c and 206d can be used to provide redundant data from array block 206d to first data amplifier bank 212c.

In addition to utilizing interblock MUX circuits 208 for improving the redundancy capabilities of the preferred embodiment 200, the preferred embodiment further includes interarray MUX circuits that allow replacement of the global word lines from one group of memory cell arrays with the global word lines of an adjacent group of memory cell arrays. This aspect of the preferred embodiment can be understood with reference to FIG. 3.

Figure 3:
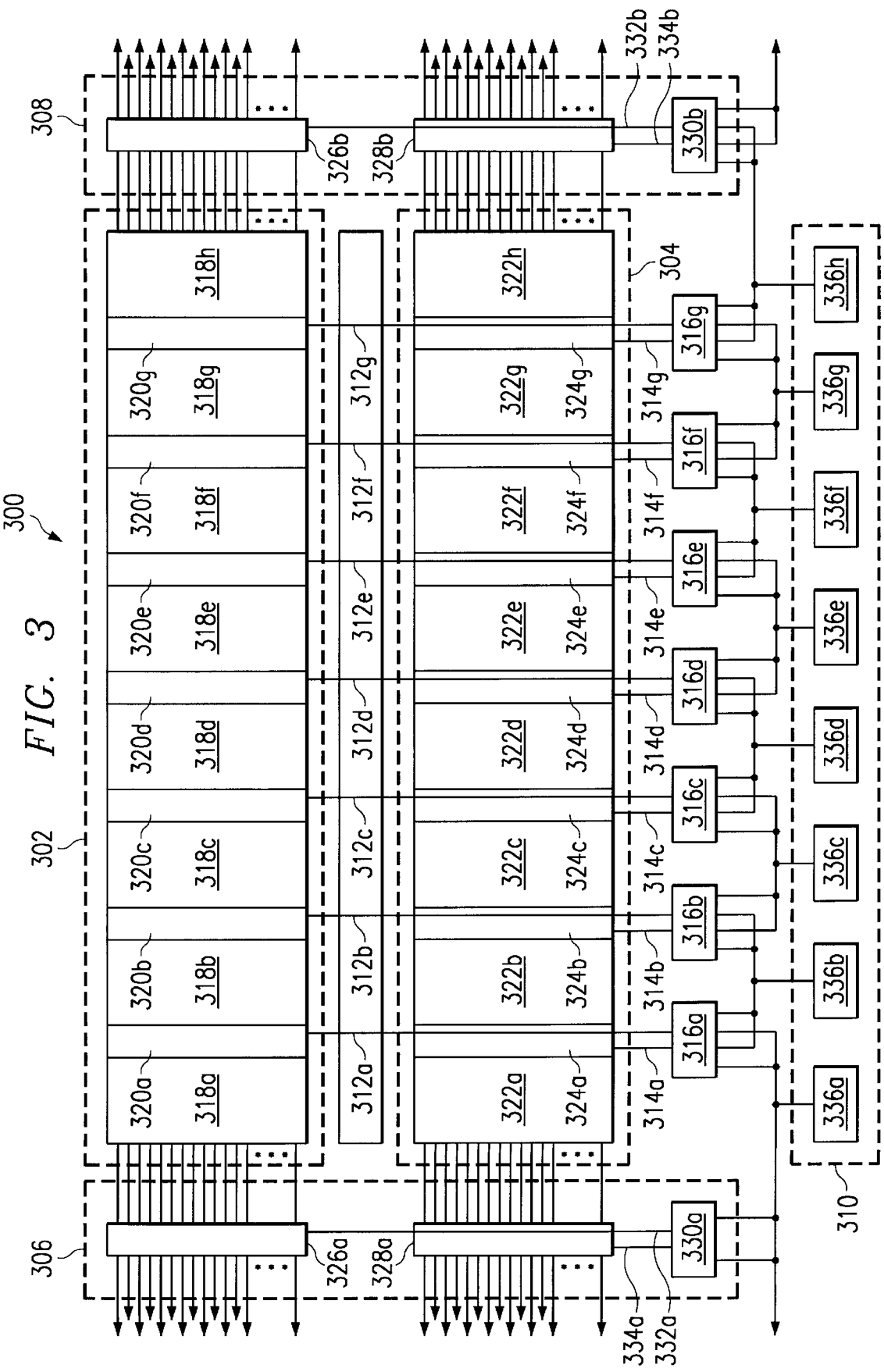
FIG. 3 is a block schematic diagram of the array blocks of the preferred embodiment.

FIG. 3 is a block schematic diagram that illustrates the structure of the array blocks according to the preferred embodiment. The portion is designated by the general reference character 300, and is shown to include an upper array block 302 and a lower array block 304. It is understood that the upper array block 302 would be part of a first array bank, while the lower array block 304 would be part of an adjacent second array bank. As just one example, the upper and lower array blocks (302 and 304) could represent the array blocks shown as items 206b in FIG. 2.

Situated at the left end of the array blocks (302 and 304) in FIG. 3 is a first interblock MUX circuit 306. A second interblock MUX circuit 308 is situated at the right end of the array blocks (302 and 304). A data amplifier bank associated with the two array blocks (302 and 304) is shown as item 310. Data I/O paths between the first and second array blocks (302 and 304) and their associated data amplifier bank 310 are provided by first I/O lines 312a–312g and second I/O lines 314a–314g, respectively. Unlike conventional semiconductor memory device arrangements, the first and second I/O lines (312a–312g and 314a–314g) are not coupled directly to the data amplifier bank 310. Instead, each I/O line (312a–312g and 314a–314g) is coupled to the data amplifier bank 310 by way of a series of interarray MUXs 316a–316g.

The first array block 302 is shown to include a number of first array groups (318a–318h), each separated from one another by first sense select circuits (320a–320g). The first array groups (318a–318h) represent a further subdivision of the memory cell arrays of the preferred embodiment. Thus, it is understood that each first array group (318a–318h) includes a like number of memory cell arrays. Each first sense select circuit (320a–320g) is coupled to its adjacent first array groups (318a–318h). For example, first sense select circuit 320a is coupled to first array group 318a and 318b. The first sense select circuits (320a–320g) amplify data on bit lines within their respective array groups, and couple selected bit lines to the first I/O lines (312a–312g).

The second array block 304 is configured in a similar fashion to the first array block 302, and includes second array groups (322a–322h) separated from one another by second sense select circuits (324a–324g). The second sense select circuits (324a–324g) operate in the same fashion as the first sense select circuits (320a–320g), coupling bit lines within their adjacent second array groups to the second I/O lines (314a–314g).

The first interblock MUX circuit 306 is shown to include an upper sense select circuit 326a, a lower sense select circuit 328a, and an interblock MUX 330a. The upper sense select circuit 326a functions in a similar fashion to the first sense select circuits (320a–320g), being coupled to the bit lines of adjacent array groups. Unlike the first sense select circuits (320a–320g), which are coupled to array groups of the same array block, the upper sense select circuit 326a is coupled to the array groups of two different array blocks. Thus, it is understood that the upper sense select circuit 326a is coupled to first array group 318a as shown, and also to an array group of an adjacent array block (not shown) that would be situated to the left of array block 302a. The upper sense select circuit 326a provides first interblock I/O lines 332a to the interblock MUX 330a. Like the upper sense select circuit 326a, the lower sense select circuit 328a is coupled to second array group 322a, and also to an array group of an adjacent array block (not shown). The lower sense select circuit 328a provides second interblock I/O lines 334a to the interblock MUX 330a.

The second interblock MUX circuit 308 has the same general configuration as the first interblock MUX circuit 306. As shown in FIG. 3, the second interblock MUX circuit 308 includes an upper sense select circuit 326b, a lower sense select circuit 328b, and an interblock MUX 330b. Data I/O paths from first and second array groups (318h and 322h) and from array groups of an adjacent array block (not shown) are provided to interblock MUX 330b by first and second interblock I/O lines (332b and 334b).

The data amplifier bank 310 of FIG. 3 is shown to include a number of data amplifier groups (336a–336h). Each data amplifier group (336a–336h) is coupled to either two interarray MUXs (316a–316g) or one interarray MUX (316a–316g) and an interblock MUX (330a–330b). For example, data amplifier group 336a is coupled to interblock MUX 330a and interarray MUX 316a, while data amplifier group 336b is coupled to interarray MUXs 316a and 316b.

The utilization of interarray MUXs provides for additional redundancy capabilities above and beyond that provided by the interblock MUX. In particular, in a standard (no redundancy implemented) read operation, first array group 318c could provide data signals, via first I/O lines 312b and 312c, to the interarray MUXs 316b and 316c. Interarray MUXs 316b and 316c would "steer" data from the first I/O lines 312b and 312c to data amplifier groups 336b and 336c. The data amplifier groups 336b and 336c would amplify the data signals, which would then be coupled to data I/Os (not shown in FIG. 3). In the event the first array group 318c includes defective memory locations that cannot be replaced by redundant memory cells within the first array group 318c, redundant memory cells from adjacent first array group 318b can be used to replace the defective locations. In such a case, when the address corresponding to the defective location within the first array group 318c is received, a redundant location within the adjacent first array group 318b will be accessed. The adjacent first array group 318b then provides data signals, via first I/O lines 312a and 312b, to the interarray MUXs 316a and 316b. Interarray MUXs 316a and 316b would "steer" data from the first I/O lines 312a and 312b to data amplifier groups 336b and 336c. In this manner, defective memory locations of one array group are replaced by redundant memory locations of an adjacent array group by operation of the interarray MUXs (316a–316g) and interblock MUXs (330a and 330b).

Figure 4:
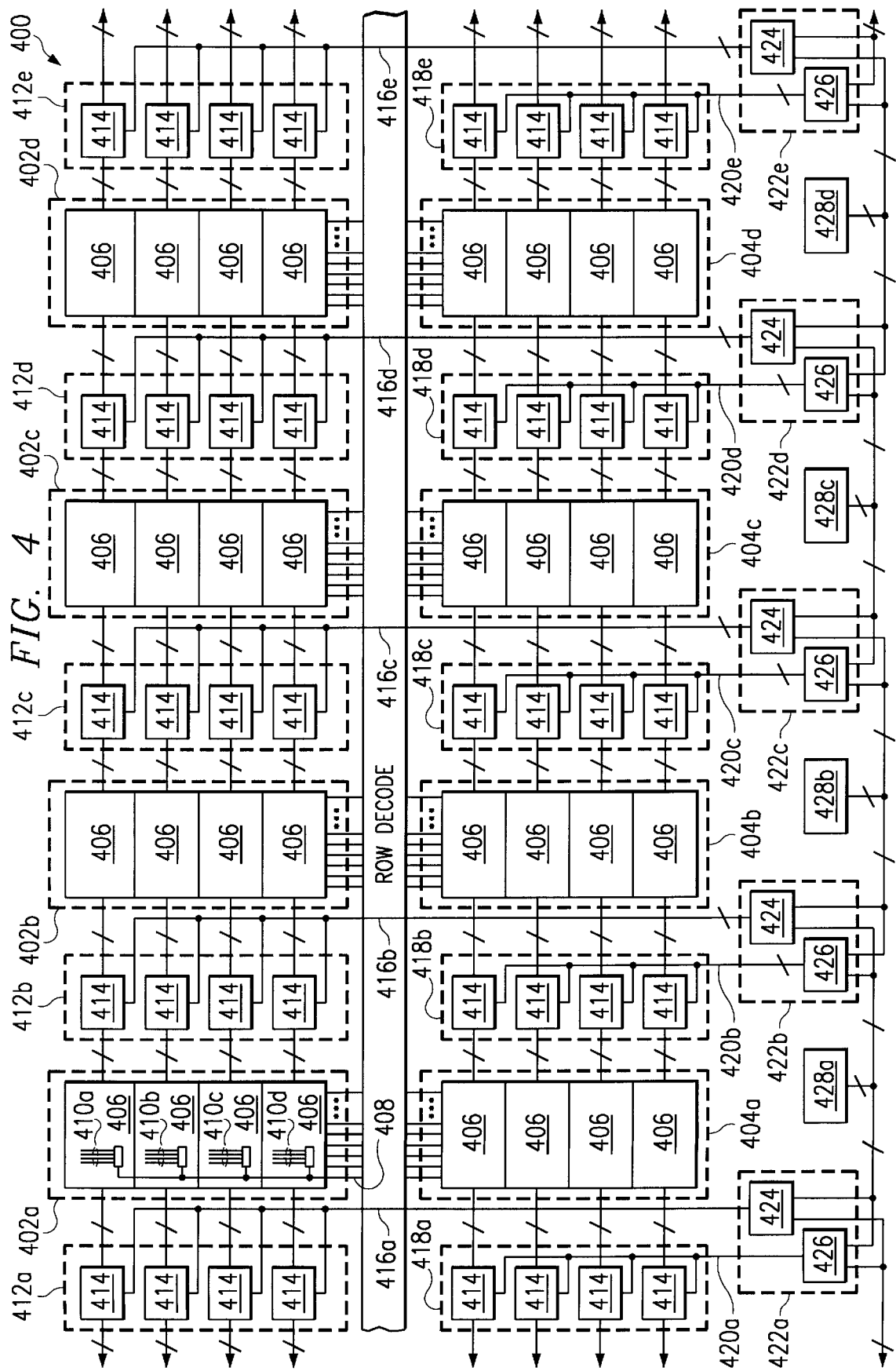
FIG. 4 is a block schematic diagram of the array groups of the preferred embodiment.

Referring now to FIG. 4, a portion of two array blocks are shown in more detail to better illustrate the operation of the array groups of the preferred embodiment. The portion is designated by the general reference character 400 and represents essentially one half of an upper array block (such as that shown as item 302 in FIG. 3) and one half of an adjacent lower array block (such as that shown as item 304 in FIG. 3). FIG. 4 thus includes four upper array groups 402a–402d, and four lower array groups 404a–404d. Each array group (402a–402d and 404a–404d) is shown to include four memory cell arrays 406. Each memory cell array 406 includes its own set of local word lines and bit lines coupled to its memory cells. In addition, the local word lines of the same array group are further coupled to global word lines associated with the array group. This is best illustrated by array group 402*a* which sets forth an exemplary global word line 408 coupled to sets of local word lines (410*a*–410*d*) with the array group 402*a*.

FIG. 4 further includes first sense select circuits (412*a*–412*e*) situated between adjacent first array groups (402*a*–402*d*). The first sense select circuits (412*a*–412*e*) are shown to include four sense select sections 414, each coupled to one memory cell array of its adjacent array groups. The sense select sections 414 of the same sense select circuit (412*a*–412*e*) are coupled to the same set of first I/O lines. The sets of first I/O lines are identified by the reference characters 416*a*–416*e*. Second sense select circuits (418*a*–418*e*) are situated between adjacent second array groups (404*a*–404*d*), and like the first sense select circuits (412*a*–412*e*), each include four sense select sections 414. The sense select sections 414 are coupled to their adjacent second array groups (404*a*–404*d*), and provide sets of second I/O lines 420*a*–420*e*. It is understood that each set of first or second I/O lines (416*a*–416*e* or 420*a*–420*e*) can include a number of I/O lines or I/O line pairs.

Referring yet again to FIG. 4, sets of first and second I/O lines (416*a*–416*e* or 420*a*–420*e*) are shown to be coupled in pairs to interarray MUXs 422*a*–422*e*. Each interarray MUX (422*a*–422*e*) includes a first MUX 424 and a second MUX 426 that couples the I/O lines to data amplifier groups 428*a*–428*d*. Within each interarray MUX (422*a*–422*e*), the first MUX 424 couples its respective set of first I/O lines (416*a*–416*e*) to one of two predetermined amplifier groups. In the same fashion, the second MUX 426 within each interarray MUX (422*a*–422*e*) couples its set of second I/O lines (420*a*–420*e*) to one of two predetermined data amplifier groups (428*a*–428*d*). For example, in the particular arrangement of FIG. 4, the first MUX 424 within interarray MUX 422*b* couples first I/O line set 416*b* to data amplifier group 428*b*, or alternatively, to data amplifier group 428*a*.

Figure 5A:
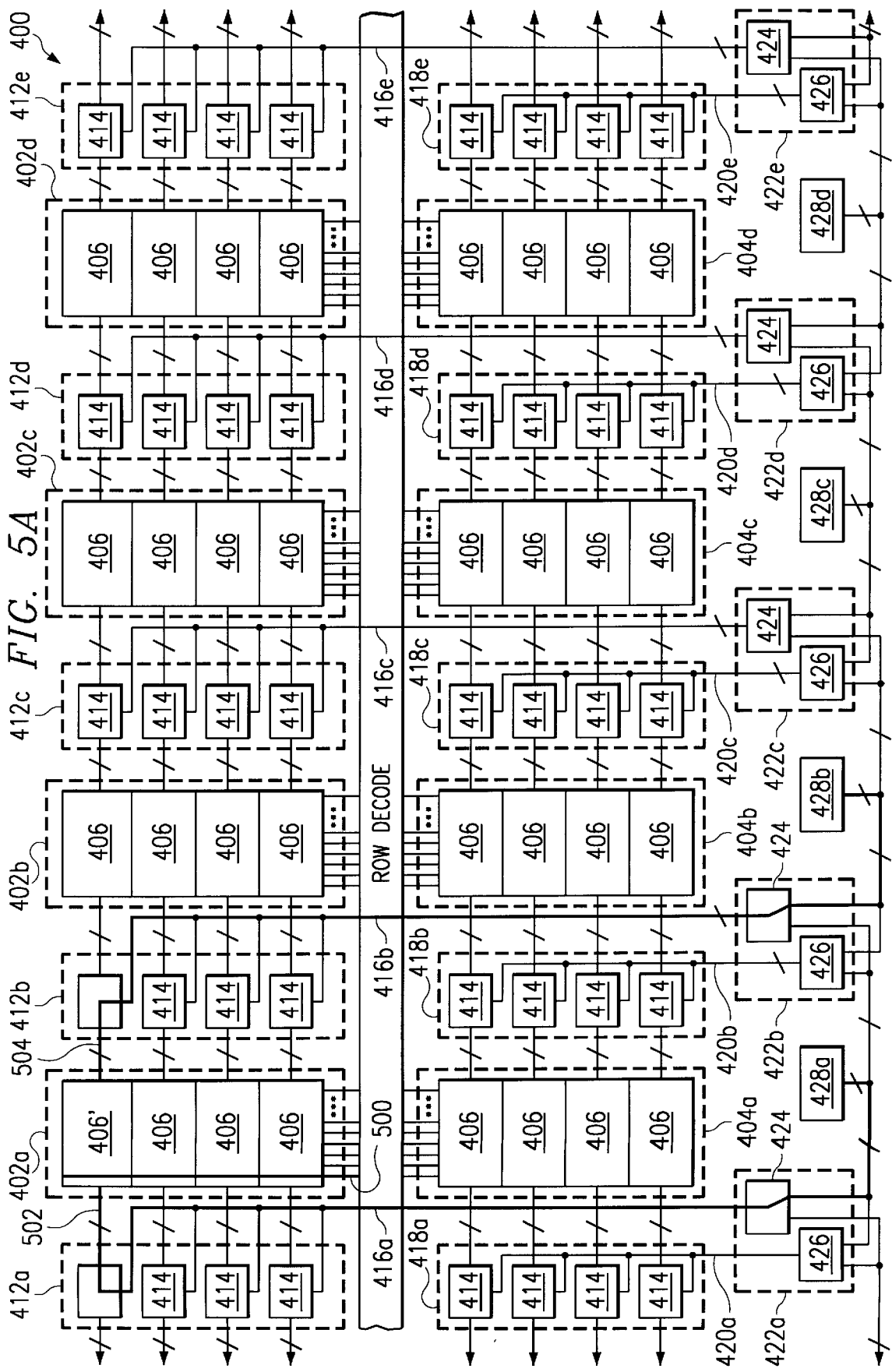
FIGS. 5A–5C set forth block schematic diagram of FIG. 4 during standard and redundant accesses.
Figure 5B:
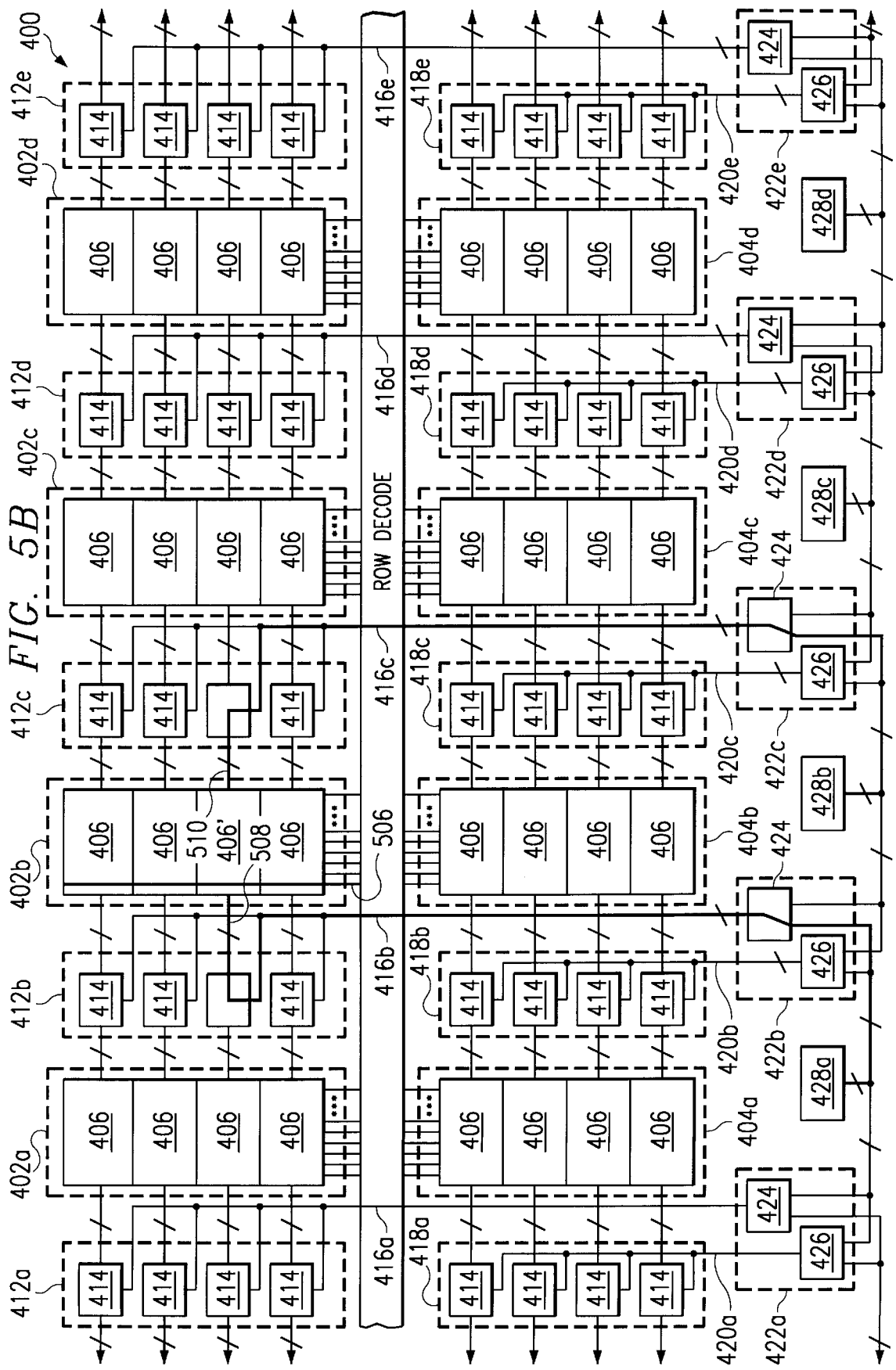
Figure 5C:
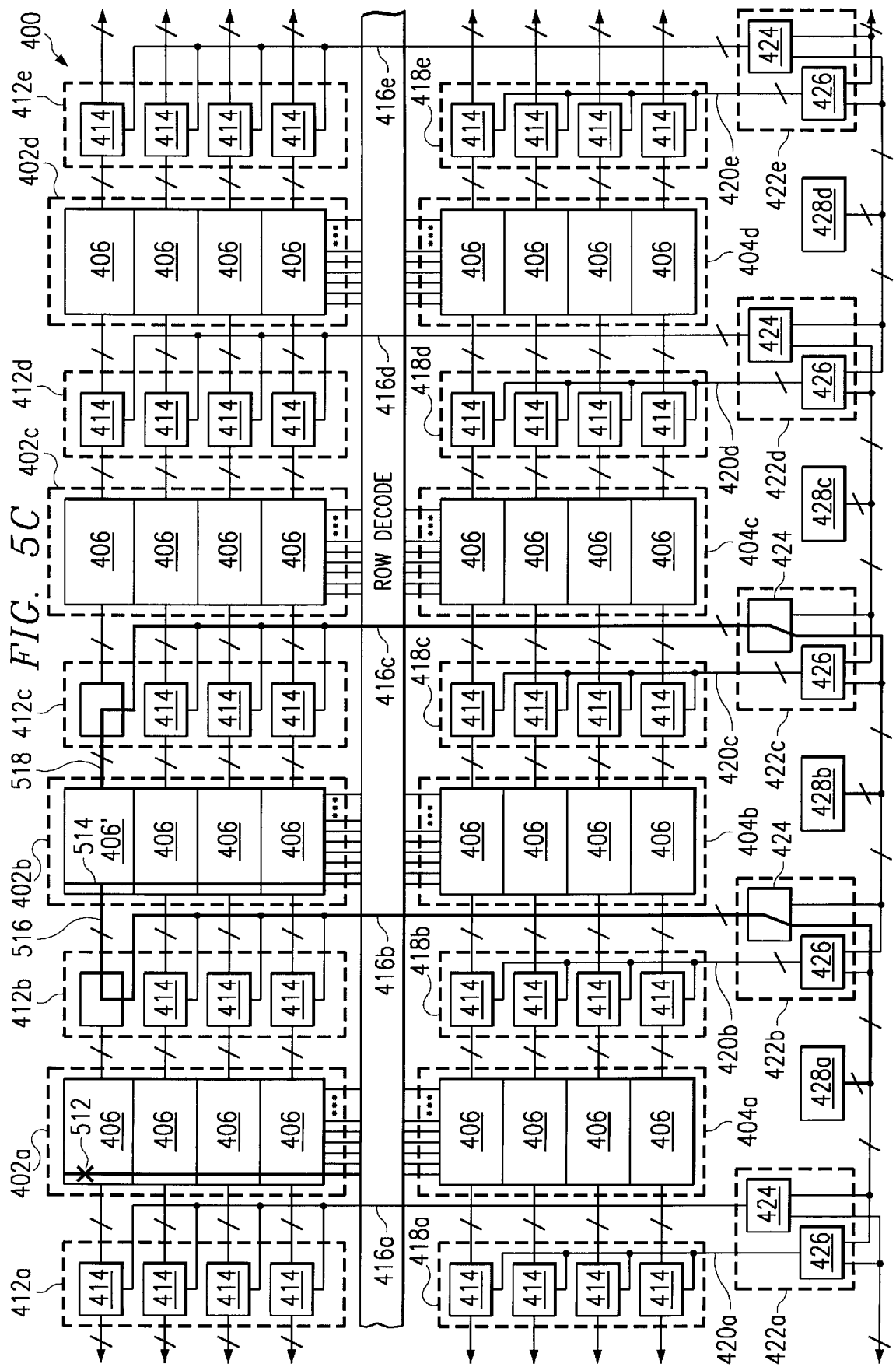

To better understand the interarray redundancy capabilities of the preferred embodiment, examples of two standard accesses and one redundant access are set forth in FIGS. 5A to 5C. FIGS. 5A–5C set forth the same block schematic diagram as FIG. 4, but with additional indications to illustrate the active portions of block diagram. FIG. 5A is an example of a standard operation which accesses the upper most memory cell array 406' of the first array group 402*a*. A global word line 500 of the first array group 402*a* is activated, resulting in a local word line (not shown) of the uppermost memory cell array 406' being activated. Memory cells are coupled to bit lines within the uppermost memory cell array 406'. The resulting data paths are shown as bold dashed lines 502 and 504. Data path 502 passes through sense select circuit 412*a* and along first I/O line set 416*a* to the interarray MUX 422*a*. In the standard access, the first MUX 424 within interarray MUX 422*a* steers the first I/O line set 416*a* to the data amplifier group 428*a*. The data path 504 passes through sense select circuit 412*b*, along first data line set 416*b*, to the interarray MUX 422*b*. In the same fashion as the interarray MUX 422*a*, the first MUX 424 within interarray MUX 422*b* couples the first data line set 416*b* to data amplifier group 428*a*.

FIG. 5B sets forth a second example of a standard data access. The standard access of FIG. 5B illustrates the access of array group 402*b*. A global word line 506 within the array group 402*b* is activated resulting in a local word line (not shown) in one of the central memory cell arrays 406' being activated. The resulting first and second data paths 508 and 510, represented by dashed bold lines, pass through sense select circuits 412*b* and 412*c* to provide data on first I/O line sets 416*b* and 416*c*. The first I/O line set 416*b* is steered by the first MUX 424 within the interarray MUX 422*b*, in the opposite direction to that of FIG. 5A, to data amplifier group 428*a*. The first I/O line set 416*c* is steered by the first MUX 424 within interarray MUX 422*c* to the data amplifier group 428*b*. In this manner, in the preferred embodiment architecture, standard accesses to adjacent array groups, such as 402*a* 402*b*, provide data paths to the same data amplifier groups (428*a* and 428*b*).

The sharing of data amplifier groups by adjacent array groups allows greater flexibility in the implementation of redundancy, by allowing redundant memory cells to be shared between adjacent array groups. This is particularly advantageous as the array groups utilize global word lines. FIG. 5C illustrates an example of a data access to a defective global word line location within the array group 402*a*. The defective global word line 512 has an "X" through it indicating that the global word line 512 is defective. It is also assumed that any redundant global word lines within the array group 402*a* are already being used, or are themselves defective, preventing any further global word line repair within the array group 402*a*. When the address corresponding to defective global word line 512 is received, redundancy circuits enable a redundant global word line 514 within adjacent array group 402*b*. The first sense select circuits 412*b* and 412*c* are enabled (as opposed to sense select circuits 412*a* and 412*b*, as is the case of a conventional access to array group 402*a*). Data paths 516 and 518 are created, coupling first I/O line sets 416*b* and 416*c* to data amplifier groups 428*a* and 428*b*, by way of first MUXs 424 within interarray MUXs 422*a* and 422*c*. In this manner, defective global word lines can be replaced by a redundant global word line of an adjacent array group. It is understood that a defective global word line can be replaced by redundant global word lines from array groups on either side. Thus, while the example of FIG. 5C illustrates replacement by an array group to the right (array group 402*b*), defective global word lines within array group 402*a* can be replaced by an array group (not shown) to the left. Such an array group may be part of a different array block.

Figure 6A:
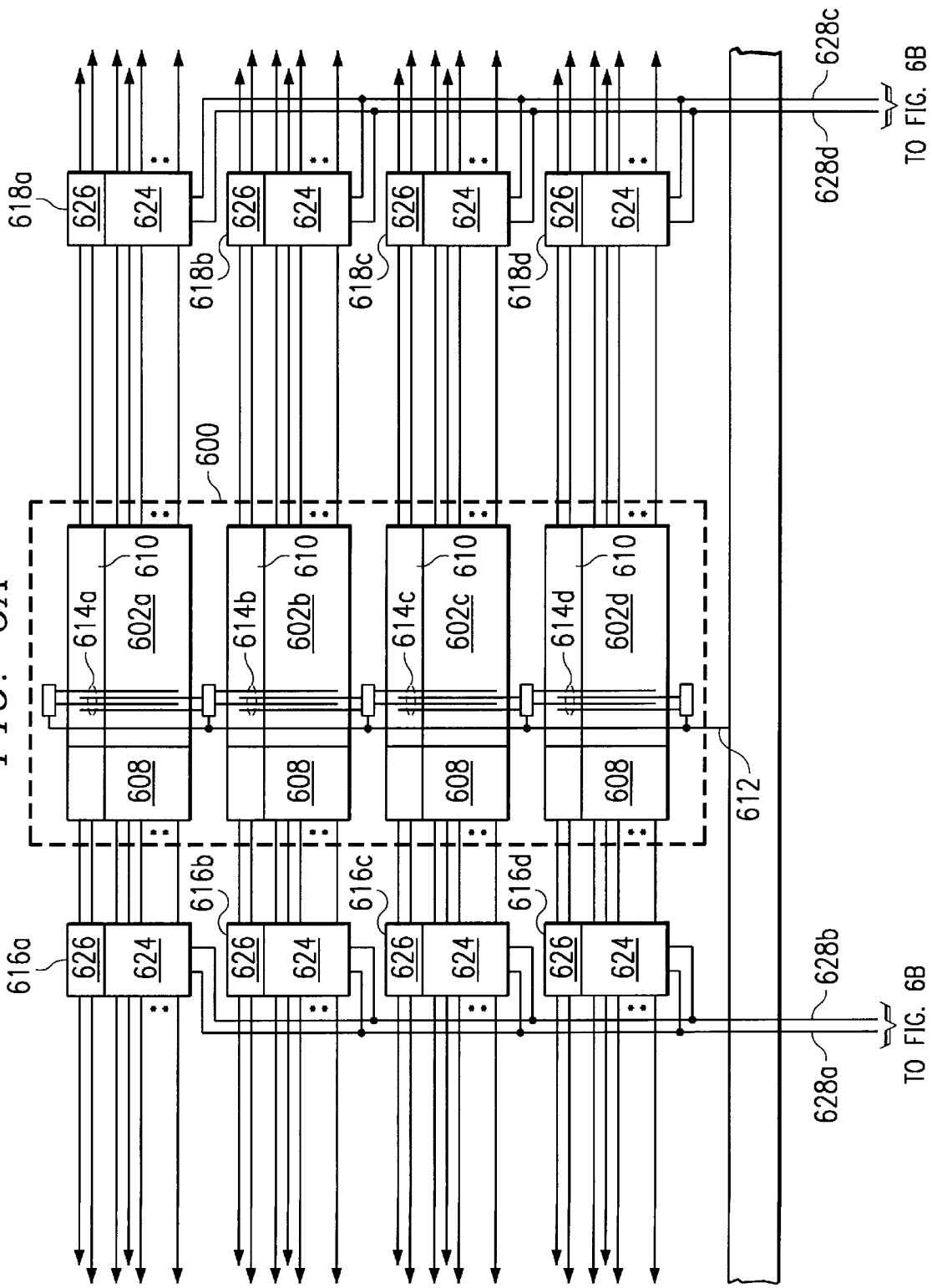
FIGS. 6A and 6B are block schematic diagrams illustrating the array groups of the preferred embodiment.
Figure 6B:
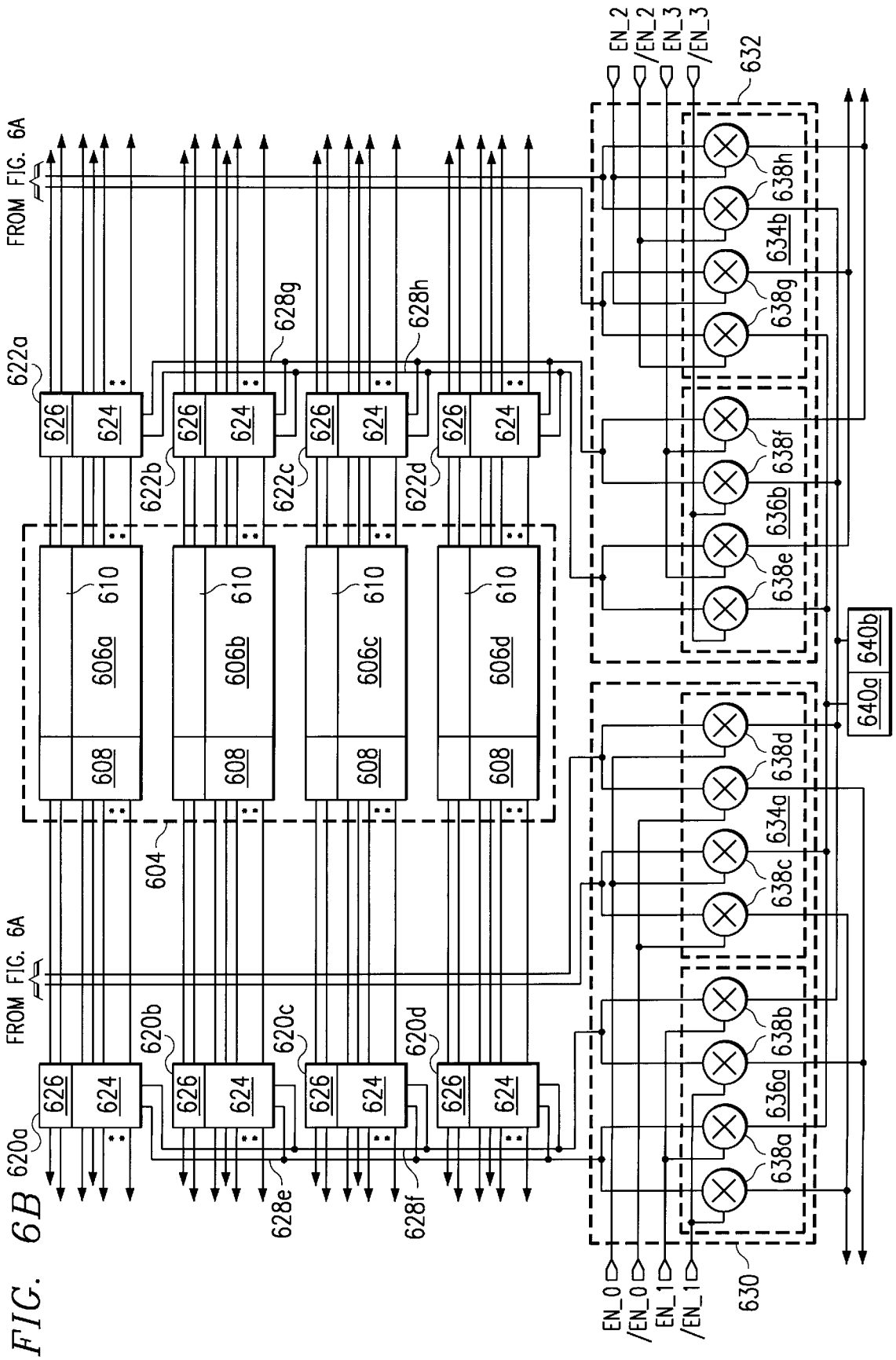

Referring now to FIG. 6, a block schematic diagram of an upper array group and lower array group are set forth in more detail. An upper array group is designated by the general reference character 600, and is shown to include four memory cell arrays 602*a*–602*d*. In the same fashion, a lower array group is designated by the reference character 604, and includes four memory cell arrays 606*a*–606*d*. Each memory cell array includes standard memory cells coupled to standard bit lines and standard local word lines. In addition, each memory cell array (602*a*–602*d* and 606*a*–606*d*) further includes redundant memory cells arranged into redundant rows 608 that are coupled to redundant word lines, and redundant columns 610 that are coupled to redundant local bit lines. The standard local word lines of the four memory cell arrays within the same group are commonly coupled to standard global word lines. An example of a standard global word line for the upper array group 600 is shown as item 612. The standard local word lines coupled to standard global word line 612 are shown as items 614*a*–614*d*. It is understood that the redundant local word lines of the same array group are commonly coupled to redundant global word lines (not shown).

The sense select sections corresponding to the upper array group 600 include left sense select sections 616*a*–616*d* and right sense select sections 618a–618d, which are coupled to memory cell arrays 602a–602d, respectively. Left sense select sections (620a–620d) and right sense select sections (622a–622d) are provided for memory cell arrays 606a–606d. Each sense select section (616a–616d, 618a–618d, 620a–620d, 622a–622d) includes a standard portion 624 coupled to the standard bit lines, and a redundant portion 626 coupled to the redundant bit lines. The left sense sections (620a–620d) are each coupled to two I/O line pairs 628a and 628b, which form a first I/O line set. In the same fashion, the right sense sections 618a–618d are coupled to I/O line pairs 628c and 628d, left sense sections 620a–620d are coupled to I/O lines pairs 628e and 628f, and right sense sections 622a–622d are coupled to I/O line pairs 628g and 628h.

Two interarray MUXs (630 and 632) are illustrated in FIG. 6. Interarray MUX 630 includes a first MUX 634a and a second MUX 636a. Similarly, interarray MUX 632 includes a first MUX 636a and a second MUX 636b. The first and second MUXs (634a, 634b, 636a and 636b) each include two pairs of transfer gates 638a–638h, with each pair being connected to one of the I/O line pairs. For example, the transfer gate pair 638d is shown to be connected to I/O line pair 628b. Within each first or second MUX (634a, 634b, 636a or 636b), according to the type of access, one of the transfer gates will be enabled, while the other is disabled. In this manner, data paths are steered to either one data amplifier group or another. In particular, if reference is made to the first MUX 634a, it is shown that the right transfer gates of pairs 638c and 638d each receive the signal EN__0. Similarly, the left transfer gates of pairs 638c and 638d each receive the /EN0 signal. When EN__0 is active, /EN__0 will be inactive, and vice versa. Thus, in a standard access operation from an array group (not shown) to the left of array group 600, EN__0 would be active, resulting in I/O line pairs 628a and 628b being coupled to the data amplifiers shown as 640a and 640b. In contrast, in a redundant access, in which array group 600 is accessed to substitute for an adjacent array group, /EN__0 will be active and EN__0 will be inactive. As a result, I/O lines pairs (628a–628b) are coupled to data amplifiers (not shown) that would be situated to the left of data amplifiers 640a and 640b. The remaining transfer gate pairs are controlled by similar signals. The transfer gate pairs of second MUX 636a are controlled by EN__1 and /EN__1 signals, the transfer gate pairs of first MUX 634b are controlled by EN__2 and /EN__2 signals, and the transfer gates of second MUX 636b are controlled by EN__3 and /EN__3 signals.

Figure 7B:
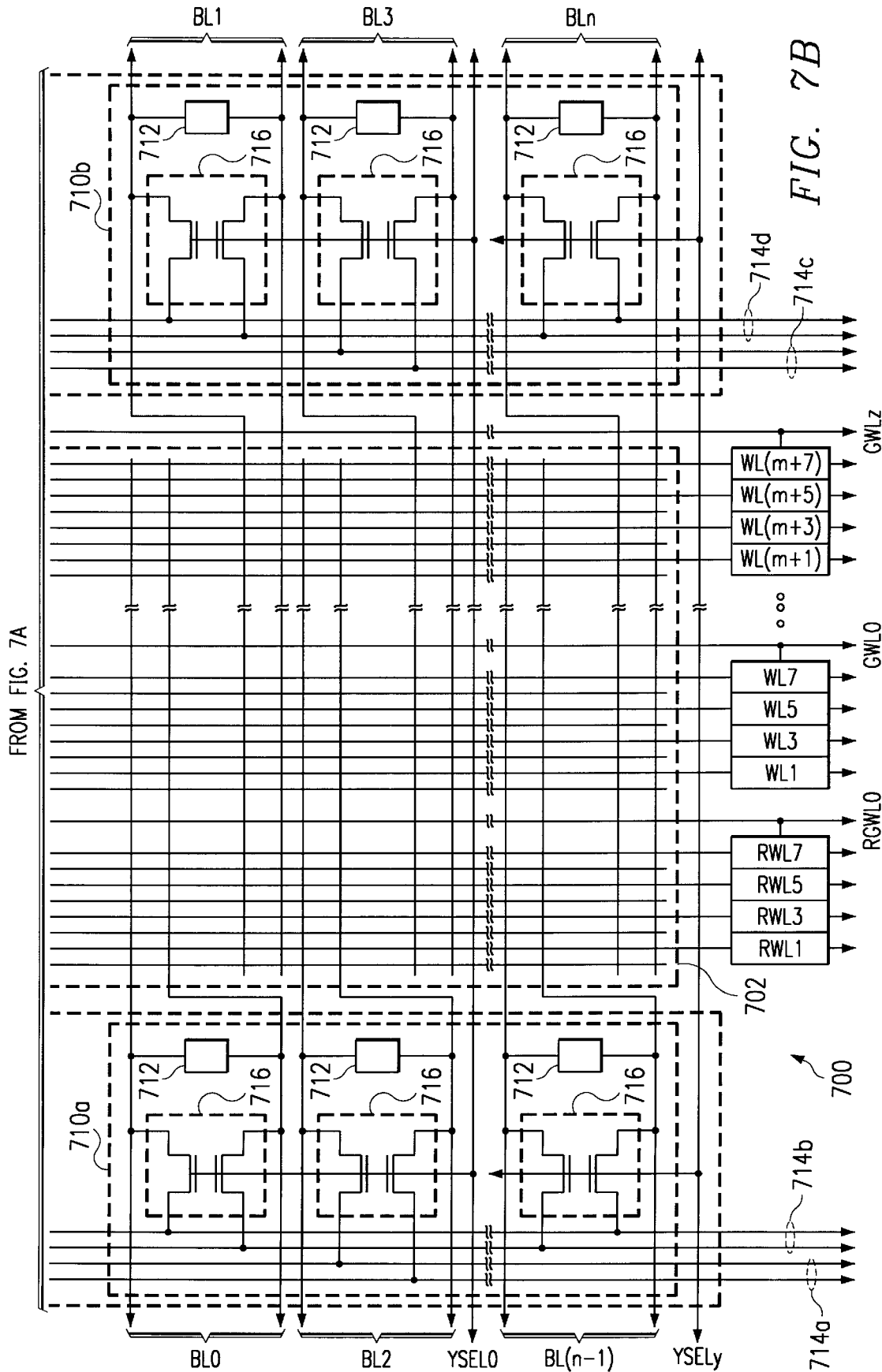

To better understand the memory cell arrays of the preferred embodiment, a portion of the preferred embodiment setting forth a memory cell array and the surrounding circuits is set forth in FIG. 7. The portion is designated by the general reference character 700, and is shown to include a memory cell array 702. The memory cell array includes standard memory cells and redundant memory cells arranged into rows and columns. Extending over the memory cell array 702 are standard even bit line pairs (BL0, BL2 . . . BL(n–1)), standard odd bit line pairs (BL1, BL3 . . . BLn), redundant even bit line pairs (RBL0, RBL2 . . . RBL6), and redundant odd bit line pairs (RBL1, RBL3 . . . RBL7). It is understood that in the particular arrangement of FIG. 7, the standard bit line pairs (BL0–BLn) are coupled to columns of standard memory cells, and the redundant bit line pairs (RBL0–RBL7) are coupled to columns of redundant memory cells.

In addition to the bit line pairs, a number of standard local word lines and redundant local word lines are also situated over the memory cell array 702. The redundant local word lines include even and odd redundant local word lines. The redundant even local word lines are connected to a number of even redundant word line drivers, shown as RWL0, RWL2 . . . RWL6, situated toward the top of the memory cell array. The odd redundant word lines are connected to odd redundant word line drivers, shown as RW1, RWL3 . . . and RWL7, situated toward the bottom of the memory cell array 702. The standard local word lines include even and odd standard local word lines, the even standard local word lines being connected to even standard word line drivers WL0, WL2 . . . WL(m+6), and the odd standard local word lines being connected to odd standard word line drivers WL1, WL3 . . . WL(m+7).

In addition to the standard and redundant local word lines, the arrangement of FIG. 7 also includes redundant and standard global word lines. The group of even redundant local word line drivers and odd redundant local word lines drivers are commonly connected to a redundant global word line, shown as RGWL0. The standard local word lines drivers are connected to standard global word lines in a similar fashion, with even word line drivers WL0, WL2, WL4, and WL6, and odd word line drivers WL1, WL3, WL5 and WL7 being connected to global word line GWL0. This arrangement is repeated with the last four even and odd local word line drivers (WLm to WL(m+7)) being coupled to a last global word line GWLz.

In the preferred embodiment, there are a total of eight redundant bit line pairs, sixty-four standard bit line pairs, eight redundant local word lines (coupled to one redundant global word line), and 512 standard local word lines (coupled to sixty-four standard global word lines).

FIG. 7 also includes a left sense section 704 and right sense section 706 associated with the memory cell array 700. The redundant portion and standard portion of the left sense section 704 are shown as items 708a and 710a, respectively. The right sense section 706 is shown to also include a redundant portion 708b and a standard portion 710b. Within the left and right sense sections (704 and 706), each bit line pair (RBL0–RBL7 and BL0–BLn) is coupled to a pass-sense circuit 712. The pass sense circuits 712 each include a sense amplifier and passgate circuits that couple a bit line pair to the sense amplifier. In addition, within the sense sections (704 and 706) each pass-sense circuit 712 is coupled to a pair of I/O lines (714a–714d) by a pair of select transistors 716. Adjacent pairs of select transistors 716 are enable by one of a number of Y-select signals. The select transistor pairs 716 within the redundant portions (708a and 708b) are enabled by one of two redundant Y-select signal RYSEL0 and RYSEL1. The select transistor pairs 716 within the standard portions (710a and 710b) are enabled by standard Y-select signals shown as YSEL0–YSELy.

It is noted that the various local word lines drivers (RWL0–RWL7 and WL0–WL(m+7)) are shared with adjacent memory cell arrays. Thus, the even redundant word line drivers (RWL0, RWL2 . . . RWL6) and even standard word line drivers (WL0, WL2 . . . WL(m+6)) drive local word lines in both memory cell array 700, and another memory cell array (not shown) situated above memory cell array 700. Likewise, the odd redundant word line drivers (RWL1, RWL3 . . . RWL7) and odd standard word line drivers (WL1, WL3 . . . WL(m+7)), in addition to driving odd local word lines of memory cell array 700, also drive odd local word lines of another memory cell array (not shown) situated below memory cell array 700.

The sense sections (704 and 706) are also shared with adjacent memory cell arrays. Thus, the left sense section 704 would be shared with another memory cell array to the left of memory cell array 702. Additional passgates (not shown) would couple the bit lines of the adjacent array to the sense amplifiers within the pass sense circuits 712. In the same fashion, the right sense section 706 would be coupled to another memory cell array situated to the right of memory cell array 702.

In the preferred embodiment memory cell array 702 of FIG. 7, the memory cells are dynamic random access memory (DRAM) cells. The memory cell array 702 is a "folded" bit line architecture, and so includes a DRAM cell situated at the intersection of each bit line pair and word line. It is understood however, that the teachings of the preferred embodiment can be applied to other types of semiconductor memory devices, including but not limited to, DRAMs with "open" bit line architectures, static random access memories (SRAMs), and nonvolatile memory devices, such as electrically erasable and programmable read only memories (EEPROMs), and ferroelectric random access memories (FRAMs).

Thus, it is understood that while the present invention has been described in terms of a detailed preferred embodiment, various changes, substitutions, and alterations could be made without departing from the spirit and scope of the invention. Accordingly, the present invention is intended to be limited only as defined by the appended claims.

What is claimed is:

1. A semiconductor memory device architecture, comprising:
    a plurality of first memory cell arrays, each having a plurality of standard memory cells coupled to standard bit lines and standard local word lines, and a plurality of redundant memory cells coupled to redundant bit lines and redundant local word lines;
    a plurality of second memory cell arrays, each having a plurality of standard memory cells coupled to standard bit lines and standard local word lines, and a plurality of redundant memory cells coupled to redundant bit lines and redundant local word lines;
    a first set of input/output (I/O) lines;
    a first standard select circuit coupled to standard bit lines of the first memory cell arrays and to standard bit lines of the second memory cell arrays, the first standard select circuit coupling selected of its standard bit lines to the first set of I/O lines;
    a first redundant select circuit coupled to the redundant bit lines of the first memory cell arrays and the second memory cell arrays, the first redundant select circuit coupling selected of its redundant bit lines to the first set of I/O lines;
    a plurality of standard global word lines coupled to the standard word lines of the first memory cell arrays and the second memory cell arrays;
    a plurality of redundant global word lines coupled to the redundant local word lines of the first memory cell arrays and the second memory cell arrays;
    a first data amplifier;
    a second data amplifier; and
    a first multiplexer that couples the first set of I/O lines to the first data amplifier and to the second data amplifier.

2. The semiconductor memory device architecture of claim 1, wherein:
    the standard bit lines of the first memory cell arrays and the second memory cell arrays include alternating even standard bit lines and odd standard bit lines; and
    the first standard select circuit is coupled to the even standard bit lines of the first memory cell arrays and to the odd standard bit lines of the second memory cell arrays.

3. The semiconductor memory device architecture of claim 1, wherein:
    the redundant bit lines of the first memory cell arrays and the second memory cell arrays include alternating even redundant bit lines and odd redundant bit lines; and
    the first redundant select circuit is coupled to the even redundant bit lines of the first memory cell arrays and to the odd redundant bit lines of the second memory cell arrays.

4. The semiconductor memory device architecture of claim 1, wherein:
    each redundant global word line is coupled to a plurality of local redundant word lines.

5. The semiconductor memory device architecture of claim 1, further including:
    a plurality of third memory cell arrays adjacent to the second memory cell array, each third memory cell array having a plurality of standard memory cells coupled to standard bit lines and standard word lines, and a plurality of redundant memory cells coupled to redundant bit lines and redundant local word lines;
    a second set of I/O lines;
    a second standard select circuit coupled to the standard bit lines of the second memory cell arrays and the third memory cell arrays, the second standard select circuit coupling selected of its standard bit lines to the second set of I/O lines;
    a second redundant select circuit coupled to the redundant bit lines of the second memory cell arrays and the third memory cell arrays, the second redundant select circuit coupling selected of its redundant bit lines to the second set of I/O lines;
    the plurality of redundant global word lines is further coupled to the redundant local word lines of the third memory cell arrays;
    a third data amplifier; and
    a second multiplexer that couples the second set of I/O lines to the second data amplifier and to the third data amplifier.

6. The semiconductor memory device architecture of claim 1, further including:
    the first and second memory cell arrays are upper memory cell arrays;
    a plurality of first lower memory cell arrays, each having a plurality of standard memory cells coupled to standard bit lines and standard local word lines, and a plurality of redundant memory cells coupled to redundant bit lines and redundant local word lines,
    a plurality of second lower memory cell arrays, each having a plurality of standard memory cells coupled to standard bit lines and standard local word lines, and a plurality of redundant memory cells coupled to redundant bit lines and redundant local word lines,
    a set of first lower I/O lines;
    a first lower standard select circuit coupled to standard bit lines of the first lower memory cell arrays and the second lower memory cell arrays, the first lower select circuit coupling selected of its standard bit lines to the first set of lower I/O lines;
    a first lower redundant select circuit coupled to redundant bit lines of the first lower memory cell arrays and the second lower memory cell arrays, the first lower redundant select circuit coupling selected of its redundant bit lines to the first set of lower I/O lines; and a first lower multiplexer that couples the first set of lower I/O lines to the first data amplifier and to the second data amplifier.

7. The semiconductor memory device architecture of claim 1, wherein:

the first set of I/O lines includes a number of I/O line pairs, each I/O line pair being coupled to the first standard select circuit and to the first redundant select circuit.

8. A semiconductor memory device that provides data and receives data on a number of data input/outputs (I/Os), the semiconductor memory device comprising:

a plurality of memory cell array blocks including a first array block and a second array block, each array block including a plurality of memory cell arrays having local word lines that are commonly coupled to global word lines, each array block providing a plurality of input/output (I/O) lines that access storage locations within the memory cell arrays of the array block;

a set of data amplifiers associated with each array block, each set of data amplifiers being coupled to the I/O lines of its associated array block and to a predetermined number of the data I/Os; and at least one interblock multiplexer circuit having a set of interblock I/O lines coupled to the memory cell arrays of the first of the array block and to the memory cell arrays of the second array blocks, and at least one interblock multiplexer that couples the interblock I/O lines to the set of data amplifiers associated with the first array block and to the set of data amplifiers associated with the second array block.

9. The semiconductor memory device of claim 8, wherein:

the at least one interblock multiplexer circuit includes an interblock multiplexer disposed between each of the array blocks, each of the interblock multiplexer circuits including a set of interblock I/O lines coupled to the memory cell arrays of adjacent array blocks, and at least one interblock multiplexer that couples the interblock I/O lines to the data amplifiers associated with the adjacent array blocks.

10. The semiconductor memory device of claim 8, wherein:

the at least one interblock multiplexer circuit further includes a plurality of interblock sense amplifiers coupled to the interblock I/O lines.

11. The semiconductor memory device of claim 8, wherein:

the plurality of array blocks are further grouped into array banks, each array bank including a predetermined number of array blocks; and the sets of data amplifiers are each coupled to the I/O lines of an associated array block in each array bank.

12. The semiconductor memory device of claim 8, wherein:

each array block includes a plurality of interarray multiplexer circuits disposed between associated adjacent memory cell arrays, each interarray multiplexer circuit including a set of interarray I/O lines coupled to the associated adjacent memory cell arrays, and at least one interarray multiplexer that couples the interarray I/O lines to a first data amplifier of the associated set of data amplifiers, and to a second data amplifier of the associated set of data amplifiers.

13. The semiconductor memory device of claim 12, wherein:

each interarray multiplexer circuit further includes a plurality of interarray sense amplifiers coupled to the interarray I/O lines.

14. The semiconductor memory device of claim 8 wherein:

each memory cell array includes standard local word lines and redundant local word lines, the standard local word lines being coupled to standard global word lines, the redundant local word lines being coupled to redundant global word lines.

15. The semiconductor memory device of claim 14 wherein:

each redundant global word line is coupled to a plurality of redundant local word lines.

16. A semiconductor memory device, comprising:

a plurality of data input/outputs (I/Os);

a plurality of first data amplifiers coupled to the data I/Os, the first data amplifiers being logically arranged into first data amplifier sets, each first data amplifier set being associated with a predetermined number of the data I/Os;

a plurality of first data I/O lines arranged into first data I/O line sets;

a plurality of first data multiplexers, each first data multiplexer coupling at least two of the first data amplifiers to an associated first data I/O line set; and a plurality of first bank memory cell arrays, each first bank memory cell array including a plurality of local word lines, the first bank memory cell arrays being arranged into first bank groups, with the first bank memory cell arrays of the same group having their local word lines commonly coupled to an associated first bank group of global word lines, at least two first bank groups being coupled to each first data I/O line set.

17. The semiconductor memory device of claim 16 wherein:

each data I/O line set includes at least one pair of data I/O lines.

18. The semiconductor memory device of claim 16, further including:

a plurality of second data I/O lines arranged into second data I/O line sets; and a plurality of second data multiplexers, each second data multiplexer coupling at least two of the first data amplifiers to an associated second data I/O line set; and a plurality of second bank memory cell arrays, each second bank memory cell array including a plurality of local word lines, the second bank memory cell arrays being arranged into second bank groups, with the second bank memory cell arrays of the same group having their local word lines commonly coupled to an associated second bank group of global word lines, at least two second bank groups being coupled to each second data I/O line set.

19. The semiconductor memory device of claim 16, further including:

a plurality of second data amplifiers coupled to the data I/Os, the second data amplifiers being logically arranged into second data amplifier sets, each second data amplifier set being associated with the predetermined number of data I/Os;

a plurality of third data I/O lines arranged into third data I/O line sets;

a plurality of third data multiplexers, each third data multiplexer coupling at least two of the second data amplifiers to an associated third data I/O line set; and a plurality of third bank memory cell arrays, each third bank memory cell array including a plurality of local word lines, the third bank memory cell arrays being arranged into third bank groups, with the third bank memory cell arrays of the same group having their local word lines commonly coupled to an associated third bank group of global word lines, at least two third bank groups being coupled to each third data I/O line set.

20. The semiconductor memory device of claim 16 wherein:

the first data multiplexers include
  interarray data multiplexers that couple at least two of the first data amplifiers within the same first data amplifier set to an associated first data I/O line set, and
  interblock data multiplexers that couple one data amplifier from one first data amplifier set to another data amplifier in a different first data amplifier set.

* * * * *